US010410706B2

(12) United States Patent
Katayama et al.

(10) Patent No.: US 10,410,706 B2
(45) Date of Patent: Sep. 10, 2019

(54) RESISTANCE CHANGE TYPE MEMORY

(71) Applicant: TOSHIBA MEMORY CORPORATION, Minato-ku, Tokyo (JP)

(72) Inventors: Akira Katayama, Yokohama Kanagawa (JP); Katsuyuki Fujita, Nishitokyo Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/913,407

(22) Filed: Mar. 6, 2018

(65) Prior Publication Data
US 2018/0197592 A1    Jul. 12, 2018

Related U.S. Application Data

(63) Continuation of application No. PCT/JP2016/056518, filed on Feb. 25, 2016.
(Continued)

(51) Int. Cl.
*G11C 11/00* (2006.01)
*G11C 11/16* (2006.01)
(Continued)

(52) U.S. Cl.
CPC ...... *G11C 11/1673* (2013.01); *G11C 11/1653* (2013.01); *G11C 11/1675* (2013.01);
(Continued)

(58) Field of Classification Search
CPC ............ G11C 11/1673; G11C 11/1653; G11C 11/1675; G11C 11/2253; G11C 11/2273; G11C 13/0023; G11C 13/004
See application file for complete search history.

(56) References Cited

U.S. PATENT DOCUMENTS 6,982,913 B2 *   1/2006   Oh ........................... G11C 7/06
                                                    365/189.06
7,692,987 B2    4/2010   Edahiro et al.
(Continued)

FOREIGN PATENT DOCUMENTS

JP    2010061743 A    3/2010
JP    2012133857 A    7/2012
JP    2013161502 A    8/2013

OTHER PUBLICATIONS

International Search Report (ISR) and Written Opinion dated May 31, 2016 issued in International Application No. PCT/JP2016/056518.

*Primary Examiner* — Pho M Luu
(74) *Attorney, Agent, or Firm* — Holtz, Holtz & Volek PC

(57) ABSTRACT

A memory includes a bit line connected to a memory cell and a read circuit to execute reading of data from the memory cell. The read circuit includes a first circuit having a first input terminal and detecting an output signal from the memory cell, a first transistor to control a current supplied to the memory cell based on a first control signal, and a second transistor. One terminal of the first transistor is connected to the first input terminal, the other terminal of the first transistor is connected to one terminal of the second transistor, the other terminal of the second transistor is connected to the bit line, and the one terminal and the other terminal of the first transistor are charged before data is read from the memory cell.

20 Claims, 11 Drawing Sheets

Related U.S. Application Data

(60) Provisional application No. 62/217,680, filed on Sep. 11, 2015.

(51) Int. Cl.
  G11C 13/00 (2006.01)
  G11C 11/22 (2006.01)

(52) U.S. Cl.
  CPC ...... G11C 11/2253 (2013.01); G11C 11/2273 (2013.01); G11C 13/004 (2013.01); G11C 13/0023 (2013.01); G11C 11/161 (2013.01); G11C 2013/0054 (2013.01); G11C 2207/002 (2013.01)

(56) References Cited

U.S. PATENT DOCUMENTS

| | | | |
|---|---|---|---|
| 8,830,728 B2 * | 9/2014 | Lee | G11C 8/00 365/148 |
| 9,047,946 B2 * | 6/2015 | Tomita | G11C 13/0004 |
| 9,378,785 B2 * | 6/2016 | Lin | G11C 13/0002 |
| 2002/0154538 A1 | 10/2002 | Inui | |
| 2010/0054020 A1 | 3/2010 | Ueda | |
| 2012/0147664 A1 | 6/2012 | Rho | |
| 2012/0155157 A1 | 6/2012 | Oh | |
| 2013/0322154 A1 | 12/2013 | Youn et al. | |

* cited by examiner

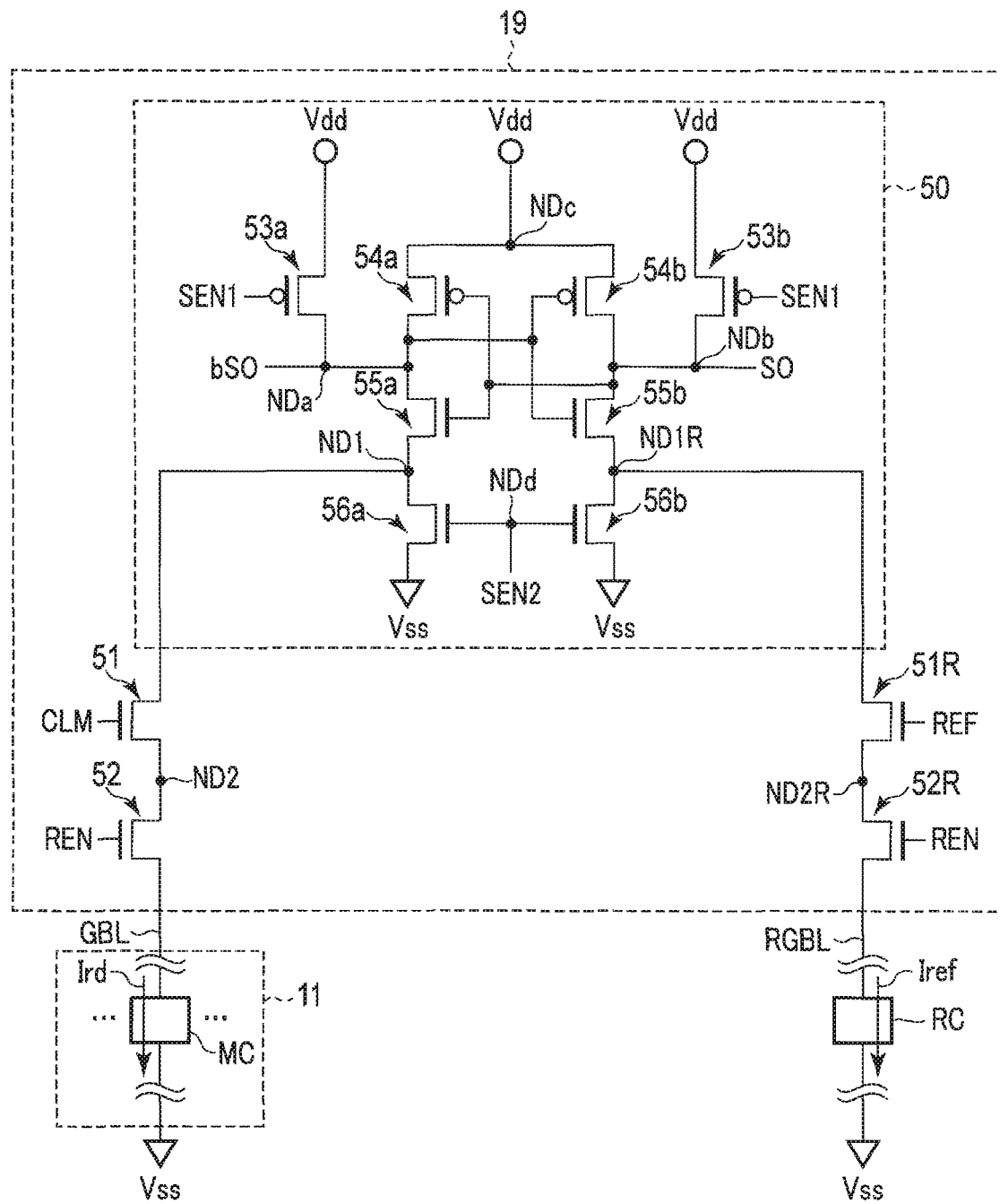
F I G. 5

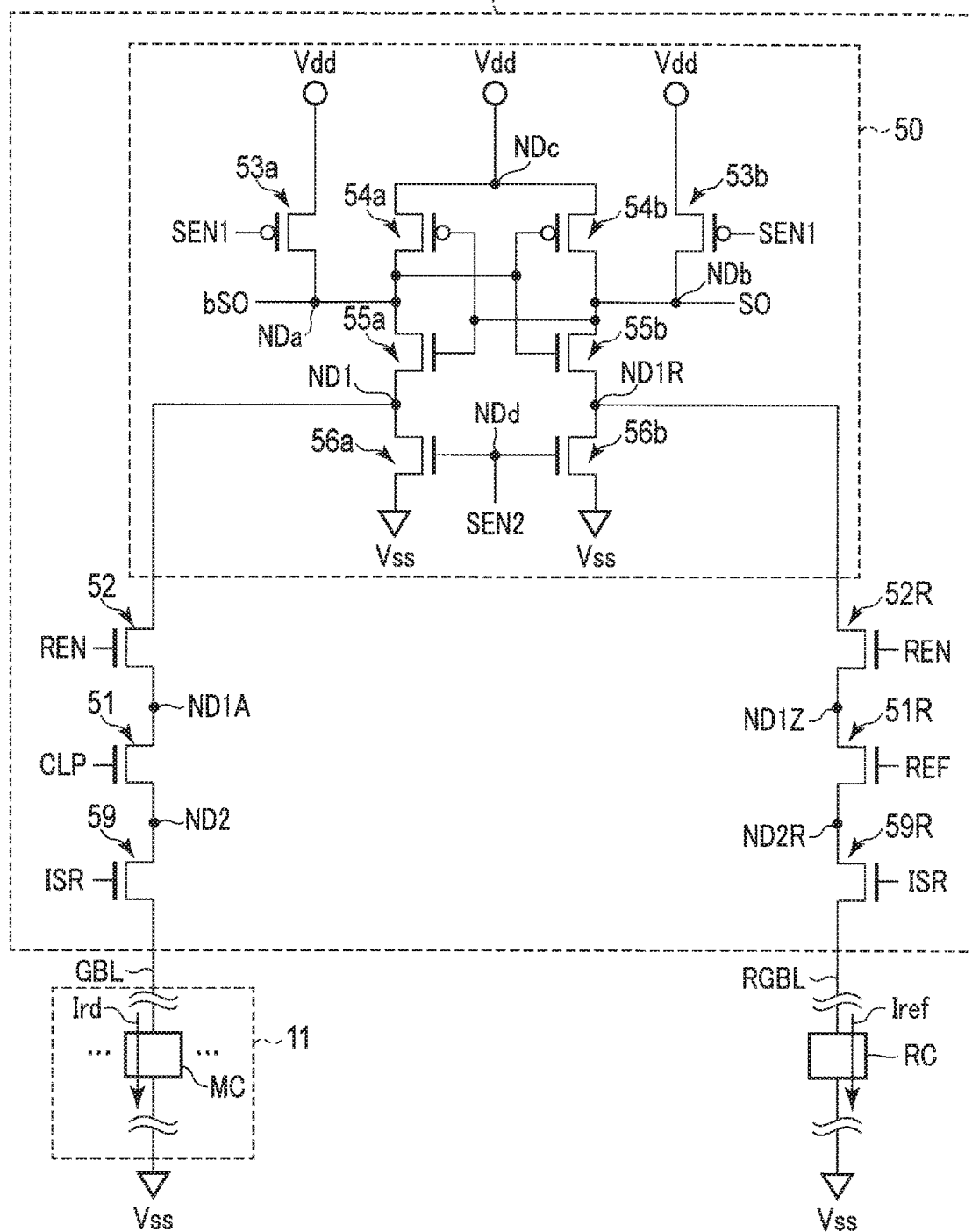
F I G. 11

RESISTANCE CHANGE TYPE MEMORY

CROSS-REFERENCE TO RELATED APPLICATIONS

This application is a Continuation Application of PCT Application No. PCT/JP2016/056518, filed Feb. 25, 2016 and based upon and claiming the benefit of priority from U.S. Provisional Application No. 62/217,680, filed Sep. 11, 2015, the entire contents of all of which are incorporated herein by reference.

FIELD

The present embodiments relate to a resistance change type memory.

BACKGROUND

In recent years, attention has been paid to resistance change type memories such as MRAMs, as next-generation memory devices.

An MRAM (Magnetoresistive Random Access Memory) is a memory device using, as memory elements, elements that utilize the magnetoresistive effect.

BRIEF DESCRIPTION OF THE DRAWINGS

FIG. 5 is an equivalent circuit diagram illustrating an internal configuration example of a read circuit in a resistance change type memory in a first embodiment;

FIG. 11 is a diagram depicting a modification of the resistance change type memory in the embodiment.

DETAILED DESCRIPTION

Figure 1:
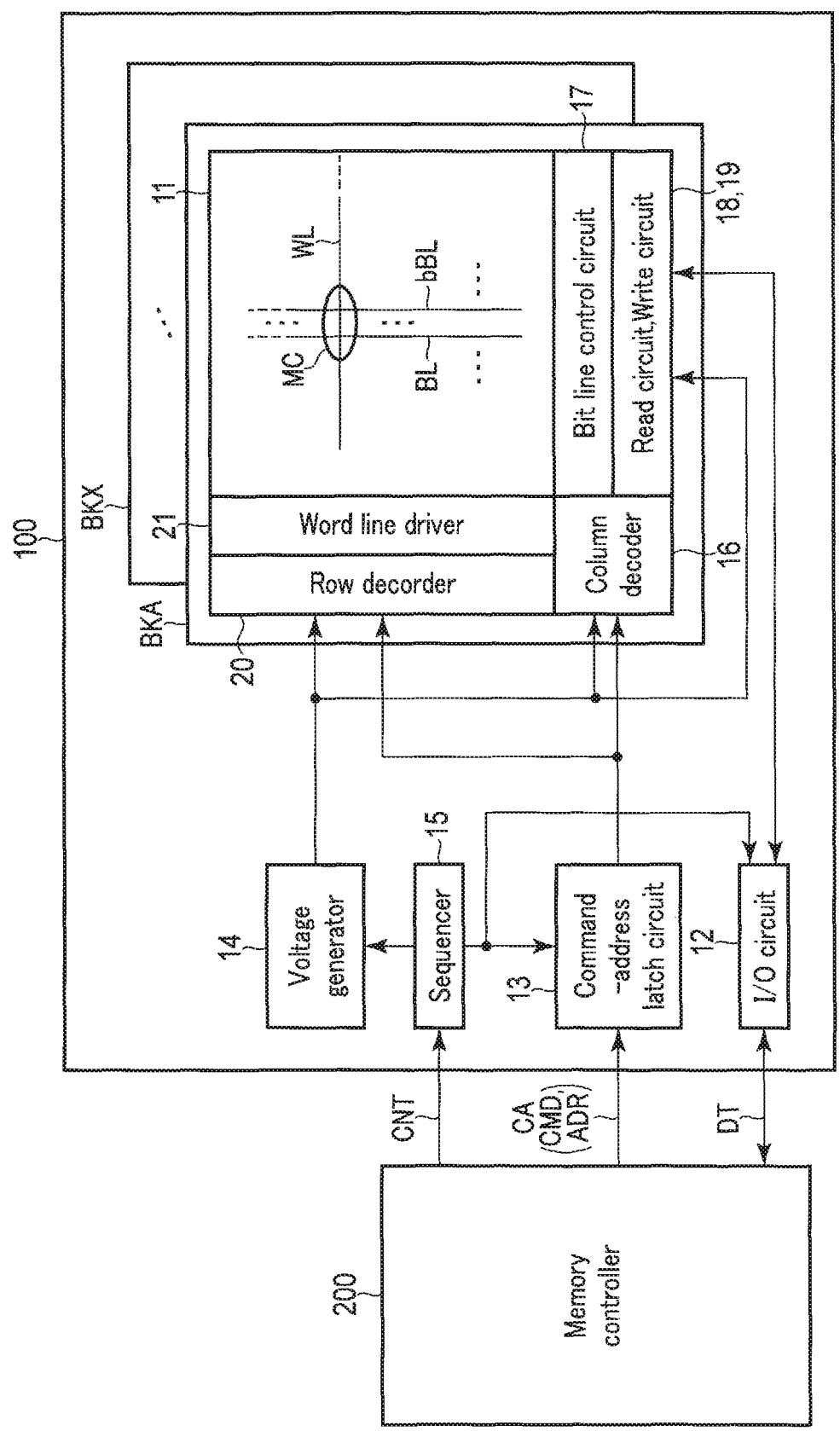
FIG. 1 is a block diagram illustrating a configuration example of a resistance change type memory in an embodiment.

In general, according to one embodiment, a resistance change type memory includes a memory cell; a bit line connected to the memory cell; and a read circuit to execute reading of data from the memory cell. The read circuit includes a first circuit having a first input terminal and detecting an output signal from the memory cell; a first transistor to control a current supplied to the memory cell based on a first control signal; and a second transistor. One terminal of the first transistor is connected to the first input terminal, the other terminal of the first transistor is connected to one terminal of the second transistor, the other terminal of the second transistor is connected to the bit line, and the one terminal and the other terminal of the first transistor are charged before data is read from the memory cell.

An embodiment will be described below with reference to the drawings. In the description below, components having substantially identical functions and configurations are denoted by identical reference numerals, and duplicate descriptions are given only when needed.

For components with letters or numbers added at ends thereof, if constituent members with different suffixed letters or numbers are not distinguished from one another, the letters or numbers at the ends of the reference numerals are omitted.

(1) First Embodiment

A resistance change type memory in a first embodiment will be described with reference to FIGS. 1 to 7.

(a) Configuration Example

A configuration example of the resistance change type memory in the first embodiment will be described with reference to FIGS. 1 to 5.

FIG. 1 is a schematic diagram schematically depicting a memory system including the resistance change type memory in the present embodiment.

As depicted in FIG. 1, in the present embodiment, a memory device 100 is coupled to a memory controller (or a host device) 200. For example, the memory controller and the memory device is provided in a storage device or a memory system.

The memory controller 200 (or the host device) requests the memory device 100 to execute data write or read.

In requesting data write, the memory controller 200 transmits a write command, an address to which data is to be written (hereinafter referred to as a write address), and data to be written to the memory device 100.

In requesting data read, the memory controller 200 transmits a read command and an address from which data is to be read (hereinafter referred to as a read address) to the memory device 100. The memory controller 200 receives data read from the memory device 100 based on the read command and the read address. The memory controller 200 transfers the read data to another device (for example, a host device).

The memory device 100 operates based on the read command and the write command.

The memory device 100 includes an input/output circuit 12, a command-address latch circuit 13, a voltage generator 14, a sequencer 15, and a plurality of banks BK (BKA, . . . , BKX).

The input/output circuit 12 temporarily holds data from the memory controller 200 and data from the bank BK.

The command-address latch circuit 13 temporarily holds a command-address CA (CMD, ADR) supplied from the memory controller 200. The command-address latch circuit 13 transfers the command CMD and the address ADR to a circuit in the memory device 100 at a certain timing. The command-address latch circuit 13 outputs the command CMD to the sequencer 15. The command-address latch circuit 13 outputs the address ADR to the bank BK.

The voltage generator 14 uses an externally supplied power supply voltage to generate various voltages for operations of the memory device 100.

The sequencer 15 receives a control signal CNT from the memory controller 200. The sequencer 15 controls the operation of each circuit inside the memory device 100 based on the command CMD and the control signal CNT.

Each bank BK includes a memory cell array 11.

The memory cell array 11 includes a plurality of memory cells MC. The memory cells MC are connected to word lines WL and bit lines BL, bBL.

Each bank BK includes a column decoder 16 and a bit line control circuit 17 in order to control columns (bit lines) in the memory cell array 11.

The column decoder 16 decodes a column address in the address.

The bit line control circuit (for example, a column switch circuit) 17 selects the bit line BL, bBL based on the decoded column address and activates the bit line BL, bBL.

Each bank BK includes a row decoder 20 and a word line driver 21 in order to control rows (word lines) in the memory cell array 11.

The row decoder 20 decodes a row address in the address ADR. The row decoder 20 selects the word line WL based on the decoded row address and activates the word line WL.

The word line driver 21 applies a voltage to the selected word line WL.

Each bank BK includes a write circuit 18 and a read circuit 19.

The write circuit 18 is a circuit for writing data to the memory cell MC. The write circuit 18 includes a source/sink circuit for generating a write current (or a write voltage).

The read circuit 19 is a circuit for reading data from the memory cell MC. The read circuit 19 includes a sense amplifier circuit and a latch circuit.

For example, the memory device in the present embodiment is a resistance change type memory. The resistance change type memory uses resistance change elements as memory elements.

Figure 2:
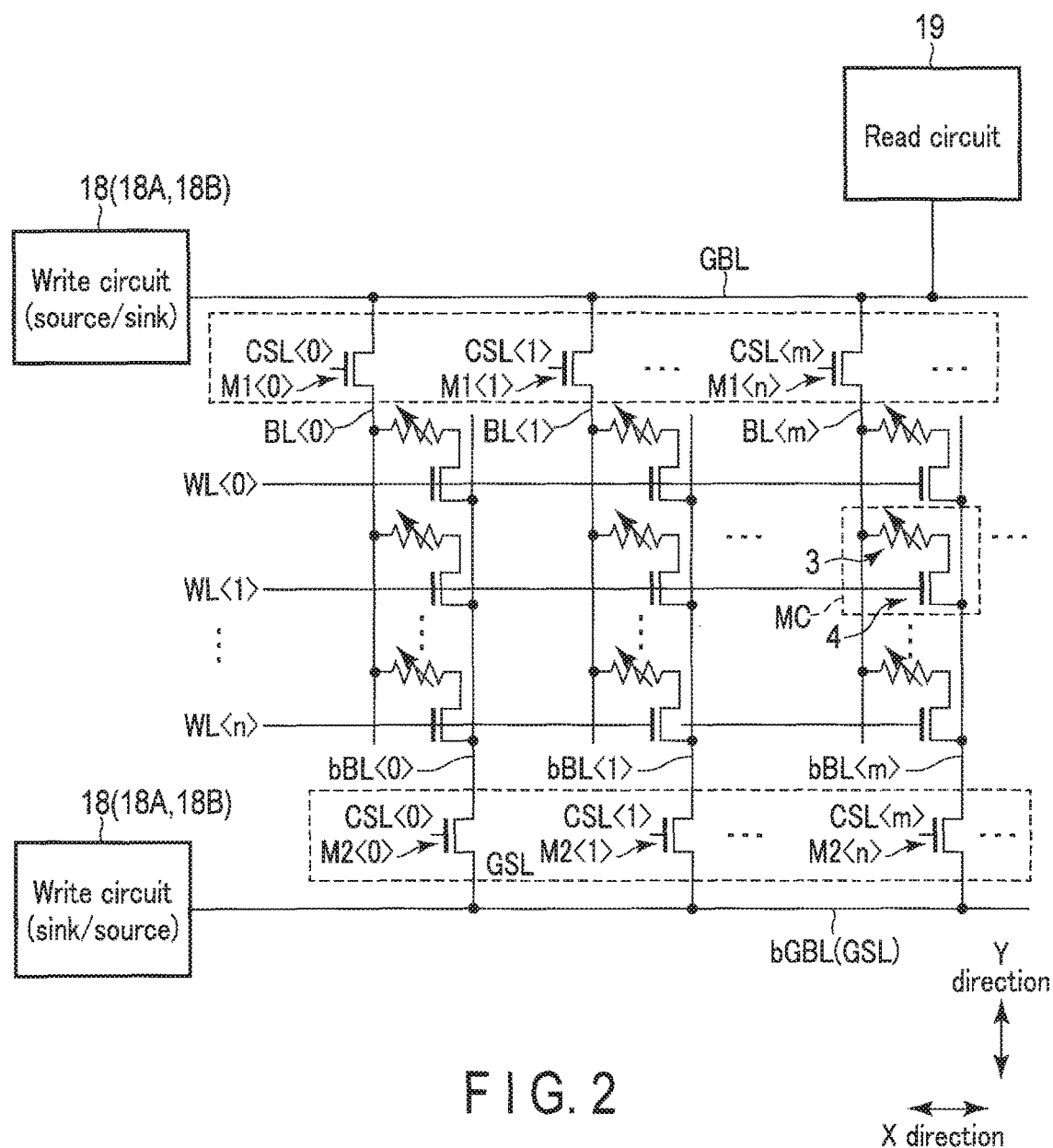
FIG. 2 is an equivalent circuit diagram illustrating a configuration example of a memory cell array in the resistance change type memory in the embodiment.

FIG. 2 is an equivalent circuit diagram depicting an example of an internal configuration of the memory cell array in the resistance change type memory in the present embodiment.

As depicted in FIG. 2, the plurality of memory cells MC are arranged in a matrix in the memory cell array 11.

A plurality of word lines WL (WL<0>, WL<1>, . . . WL<n>) are provided in the memory cell array 11. The word lines WL extend in an X direction. The plurality of memory cells MC arranged in the X direction are connected to one of the word lines WL. n is an integer of 1 or more.

The plurality of bit lines BL (BL<0>, BL<1, . . . , BL<m>) and the plurality of bit lines bBL (bBL<0>, bBL<1>, . . . , bBL<m>) are provided in the memory cell array 11. The bit lines BL, bBL extend in an Y direction. m is an integer of 1 or more. The two bit lines BL, bBL adjacent to each other in the X direction form a pair. A pair including the two bit lines BL, bBL forming the pair is hereinafter referred to as a bit line pair.

The plurality of memory cells MC arranged in the Y direction are connected to one bit line pair (bit lines BL, bBL).

For example, when the memory cell array 11 has a hierarchical bit line structure, the bit line BL is connected to a global bit line GBL via a switch element M1 (M1<0>, M1<1>, . . . , M1<m>). Furthermore, the bit line bBL is connected to a global bit line bGBL via a switch element M2 (M2<0>, M2<1>, . . . , M2<m>).

A plurality of the global bit lines GBL and a plurality of global bit lines bGBL may be provided in one memory cell array 11.

A control signal CSL (CSL<0>, CSL<1>, . . . , CSL<m>) is supplied to control terminals of the switch elements M1, M2. Turn on/off of the switch elements M1, M2 is controlled based on the control signal CSL. For example, the switch elements M1, M2 are field effect transistors (for example, N-type MOS transistors).

For example, the write circuit 18 (18A, 18B) is connected to the global bit lines GBL, bGBL. According to data write, one of the write circuits 18 serves as a source circuit, and the other write circuit 18 serves as a sink circuit.

For example, the read circuit 19 is connected to the global bit line GBL. During data read, one global bit line GBL (and the bit line BL) is set to a high voltage side, whereas the other global bit line bGBL (and the bit line bBL) is set to a low voltage side (ground side).

For clarification of description, the global bit line bGBL set to the low potential side during data read is referred to as a global source line GSL, and the bit line bBL set to the low voltage side during data read is referred to as a source line SL.

As depicted in FIG. 2, one memory cell MC includes one memory element 3 and one select element 4.

One end of the memory element 3 is connected to the bit line BL. The other end of the memory element 3 is connected to one end of the select element 4. The other end of the select element 4 is connected to the bit line (source line) bBL. A control terminal of the select element 4 is connected to the word line WL.

The memory element 3 is a resistance change element 3. The resistance change element 3 may take a plurality of resistance values (resistance states). Data to be stored (for example, "1" or "0") is associated with a resistance value of the resistance change element 3. Thus, the resistance change element 3 functions as the memory element 3.

The select element 4 is, for example, a field effect transistor (hereinafter referred to as a cell transistor) 4. Turn on/off of the cell transistor 4 is controlled according to an operation of the memory cell MC, to select a memory cell to which data is to be written or from which data is to be read (hereinafter referred to as a selected cell).

Figure 3:
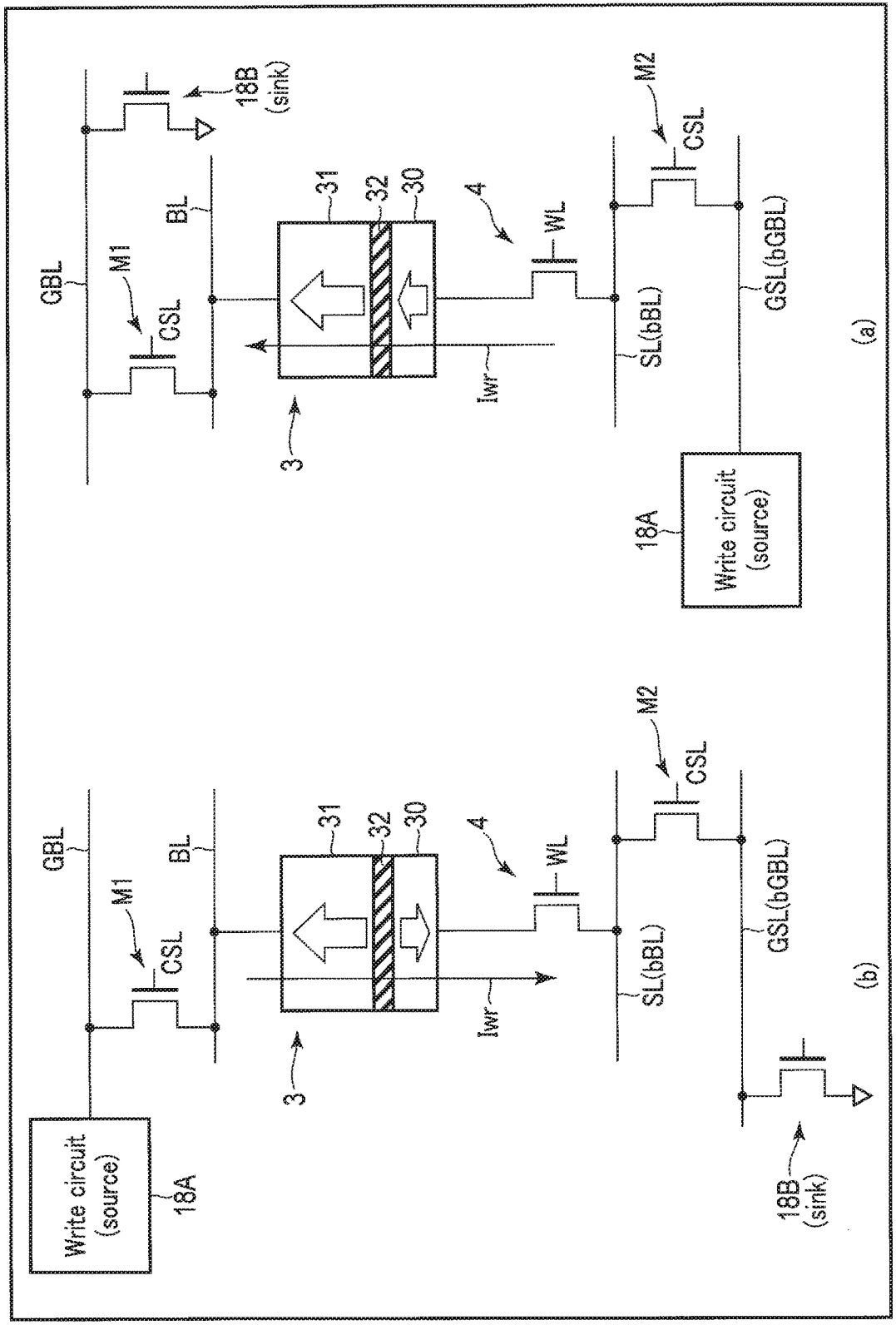
FIG. 3 is an equivalent circuit diagram illustrating a configuration example of a memory cell and a write circuit in the resistance change type memory in the embodiment.

FIG. 3 is a diagram illustrating a configuration example of the memory cell and the write circuit in the resistance change type memory in the present embodiment.

In the present embodiment, the resistance change type memory is a magnetic memory. The magnetic memory includes magnetoresistive elements as memory elements (resistance change elements). For example, the magnetic memory is an MRAM. However, the magnetic memory as a memory device in the present embodiment may be a memory device other than the MRAM so long as magnetoresistive elements are used as memory elements.

The magnetoresistive element 3 is, for example, an element including a magnetic tunnel junction (MTJ element). The MTJ element 3 includes at least a storage layer 30, a reference layer 31, and a tunnel barrier layer 32. The tunnel barrier layer 32 is provided between the storage layer 30 and the reference layer 31.

The storage layer 30 is a magnetic layer in which magnetization is variable in direction. The reference layer 31 is a magnetic layer in which magnetization is substantially invariable in direction. The magnetic layers as the storage layer 30 and the reference layer 31 (for example, CoFeB system magnetic layers) have perpendicular magnetic anisotropy. The tunnel barrier layer 32 is, for example, an insulating film including MgO as a main component.

The resistance value of the MTJ element 3 changes according to a relative relation between the direction of the magnetization in the reference layer 31 and the direction of the magnetization in the storage layer 30. When the direction of the magnetization in the storage layer 30 is the same as the direction of the magnetization in the reference layer 31 as depicted in (a) of FIG. 3 (when the MTJ element is in a magnetization parallel state), the MTJ element 3 has a first resistance value R1. When the direction of the magnetization in the storage layer 30 is different from the direction of the magnetization in the reference layer 31 as depicted in (b) of FIG. 3 (when the MTJ element is in a magnetization anti-parallel state), the MTJ element 3 has a second resistance value R2.

First data (for example, "1" data) is associated with the MTJ element 3 in a state where the MTJ element 3 has the first resistance value R1 (first resistance state). Second data (for example, "0" data) is associated with the MTJ element 3 in a state where the MTJ element 3 has the second resistance value (second resistance state).

In a spin transfer torque (STT) type MRAM, data write (write operation) is performed by controlling a magnetization arrangement in the MTJ element 3 using STT.

A write operation on the memory cell including the MTJ element 3 is performed by passing a current (hereinafter referred to as a write current) Iwr through the MTJ element 3 to change the direction of the magnetization in the storage layer 30. A current value of the write current Iwr is equal to or larger than a magnetization inversion threshold for the storage layer 30 and smaller than a magnetization inversion threshold for the reference layer 31. The magnetization inversion threshold is a current value for inverting the magnetization in the magnetic layer.

When the write current Iwr is supplied to the MTJ element 3 in the selected cell, the cell transistor 4 is set to an on state.

In the SST type MRAM, the direction of the magnetization in the storage layer 30 changes according to the direction in which the write current Iwr flows through the MTJ element 3.

When the direction of the magnetization in the storage layer 30 is set the same as the direction of the magnetization in the reference layer 31 (magnetization parallel state) as depicted in (a) of FIG. 3, the write circuit 18 (18A, 18B) passes the write current Iwr in a direction from the storage layer 30 toward the reference layer 31. In (a) of FIG. 3, a storage layer 30-side terminal of the MTJ element 3 is connected to the source-side write circuit 18A, and a reference layer 31-side terminal of the MTJ element 3 is connected to a sink-side write circuit 18B.

The write current Iwr causes a spin torque resulting from a spin in the same direction as that of the magnetization in the reference layer 31 to act on the magnetization in the storage layer 30. Thus, the direction of the magnetization in the storage layer 30 is aligned with the direction of the magnetization in the reference layer 31. Hence, the resistance value of the storage layer 30 is the first resistance value R1. Thus, the first data is written in the memory cell MC (MTJ element 3).

When the direction of the magnetization in the storage layer 30 is set opposite to the direction of the magnetization in the reference layer 31 (magnetization anti-parallel state) as depicted in (b) of FIG. 3, the write circuit 18 passes the write current Iwr in a direction from the reference layer 31 toward the storage layer 30. In (b) of FIG. 3, the storage layer 30-side terminal of the MTJ element 3 is connected to the sink-side write circuit 18B, and the reference layer 31-side terminal of the MTJ element 3 is connected to the source-side write circuit 18A.

The write current Iwr causes a spin torque resulting from a spin in the direction opposite to the direction of the magnetization in the reference layer 31 to act on the magnetization in the storage layer 30. Thus, the direction of the magnetization in the storage layer 30 is opposite to the direction of the magnetization in the reference layer 31. Hence, the resistance value of the MTJ element 3 is the second resistance value R2. Thus, the second data is written to the memory cell MC (MTJ element 3).

In FIG. 3, the reference layer 31 is connected to the global bit line GBL side, and the storage layer 30 is connected to the global source line GSL side via the cell transistor 4. However, depending on the internal configuration of the memory cell MC, the reference layer 31 may be connected to the global source line GSL side, and the storage layer 30 may be connected to the global bit line GBL side.

Figure 4:
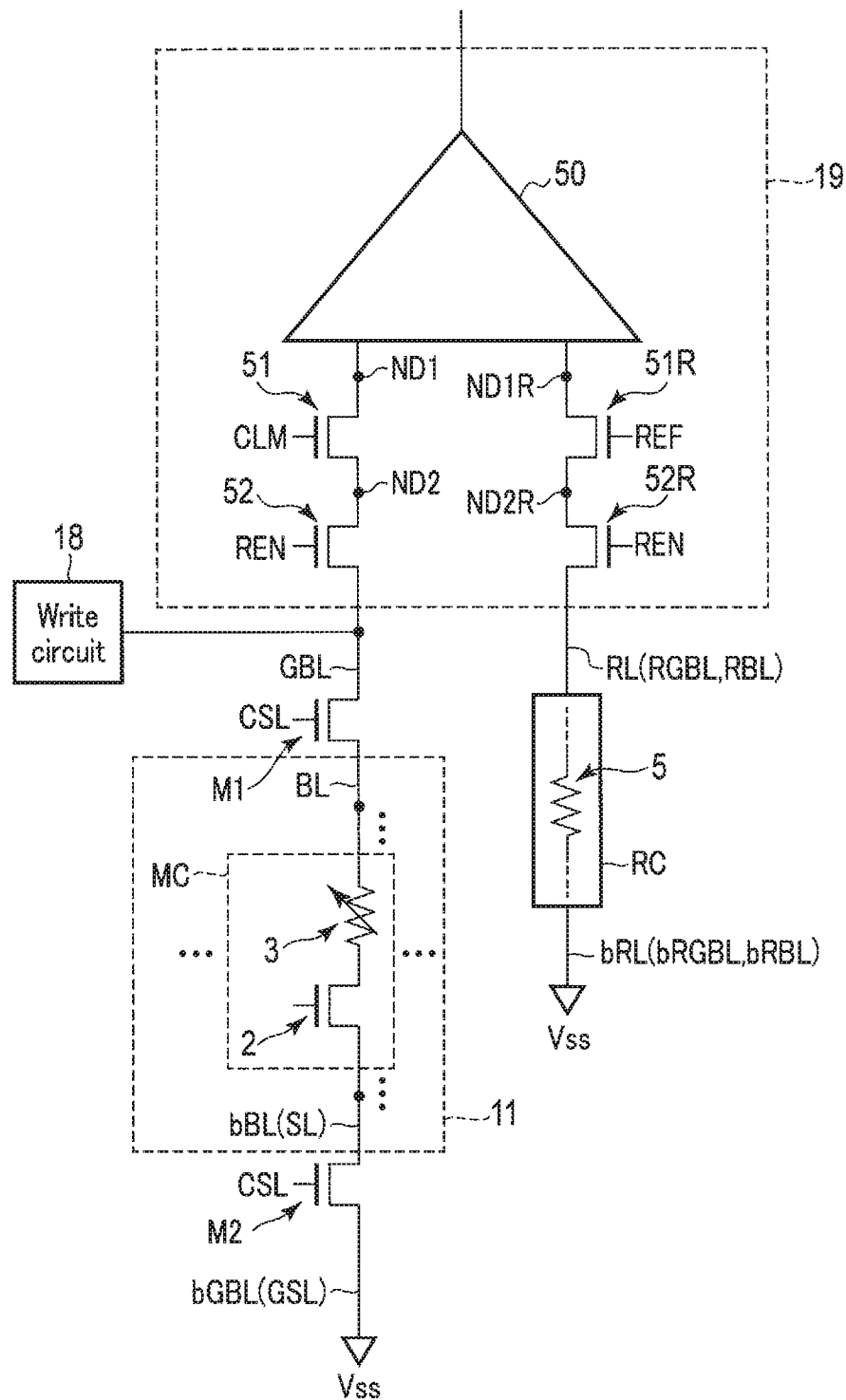
FIG. 4 is an equivalent circuit illustrating a basic configuration of a read circuit in the resistance change type memory in the embodiment.

FIG. 4 is an equivalent circuit diagram illustrating a configuration example of the read circuit in the resistance change type memory in the present embodiment.

As depicted in FIG. 4, during reading (read operation) of data from the resistance change type memory (for example, the MRAM), a sense amplifier circuit 50 in the read circuit 19 is connected to the memory cell MC.

One input terminal of the sense amplifier circuit 50 is connected to the memory cell MC (selected cell). During data reading, one end of the memory cell MC is connected to the one input terminal via the global bit line GBL, the bit line BL, and a plurality of switch elements M1, 51, 52. The other end of the memory cell MC is connected to a ground terminal Vss via the source line SL (bBL), the global source line GSL (bGBL), and the switch element M2.

The sense amplifier circuit 50 detects an output signal from the memory cell MC and amplifies the detected signal.

The read circuit 19 outputs the amplified signal as data DT read from the memory cell MC to the outside (for example, the I/O circuit 12) of the read circuit 19.

In this manner, the read circuit 19 reads the data stored in the memory cell MC.

A read operation on the memory cell including the MTJ element is performed by passing a read current (cell current) Ird through the MTJ element 3. A current value of the read current Ird is smaller than the magnetization inversion threshold for the storage layer 30.

When the read current Ird is passed through the MTJ element 3 in the selected cell MC, the cell transistor 4 and the switch elements M1, M2 are turned on.

The sense amplifier circuit 50 detects the current value of the read current Ird flowing through the MTJ element 3, as an output signal from the memory cell MC.

The read current Ird flowing through the MTJ element 3 with the first resistance value R1 has a first current value i1. A second current value i2 of the read current Ird flowing through the MTJ element 3 with the second resistance value R2 (R2>R1) is smaller than the first current value i1.

The sense amplifier circuit 50 compares the output signal (read current) from the memory cell MC with a certain reference signal to determine the magnitude of the output signal. For example, to allow the magnitude of the read current Ird to be determined, a reference current Iref is supplied to the other input terminal (hereinafter also referred to as a reference input terminal) of the sense amplifier circuit 50.

To allow the reference current Iref for the sense amplifier circuit 50 to be generated and supplied, a reference circuit RC is connected to the reference input terminal of the sense amplifier circuit 50.

One end of the reference circuit RC is connected to the other input terminal of the sense amplifier circuit 50 via a first reference interconnect RL and a plurality of elements 51R, 52R. The first reference interconnect RL includes a reference global bit line RGBL and a reference bit line RBL.

The other end of the reference circuit RC is connected to the ground terminal Vss via a second reference interconnect bRL and a plurality of elements (not depicted in the drawings). The second reference interconnect bRL includes a reference global source line RGSL and a reference source line RSL.

The reference circuit RC, for example, has a circuit configuration similar to the circuit configuration of the memory cell MC. The reference circuit RC is referred to as a reference cell.

The reference cell RC includes, for example, a resistance element (reference resistance element) 5 and a cell transistor (not depicted in the drawings) as a select element. For example, the reference resistance element 5 includes at least one of a silicon resistance element, a metal resistance element, and the MTJ element 3.

For example, the resistance value of the reference resistance element 5 is an intermediate value (R1+R2)/2 between the first resistance value R1 and the second resistance value R2. Thus, the current value of the reference current Iref is smaller than the current value i1 of the read current Ird flowing through the MTJ element 3 with the first resistance value R1 and larger than the current value i2 of the read current Ird flowing through the MTJ element 3 with the second resistance value R2.

A comparison between the read current Ird and the reference current Iref allows the data stored in the memory cell MC to be determined.

In the read circuit 19, the two transistors 51, 52 are connected between the sense amplifier circuit 50 and the global bit line GBL in order to control the read operation. The transistors 51, 52 are N-type transistors (for example, N-type MOS transistors).

One end of a current path in the transistor 51 is connected to a node ND1 at the input terminal of the sense amplifier circuit 50. The other end of the current path in the transistor 51 is connected to one end of a current path in the transistor 52 via a node ND2. The one end of the current path in the transistor 52 is connected to the node ND2. The other end of the current path in the transistor 52 is connected to the global bit line GBL.

A control signal (clamp signal) CLM is supplied to a gate of the transistor 51. The control signal CLM is a gate voltage with a certain magnitude. The transistor 51 clamps the potential of the global bit line GBL and the potential of the bit line BL to a voltage value VCLM according to the control signal (gate voltage) CLM. Thus, the magnitude of the current Ird passed through the memory cell MC is controlled. For distinction from the other transistors, the transistor 51 is hereinafter referred to as the clamp transistor.

A control signal (read enable signal) REN is supplied to a gate of the transistor 52. The transistor 52 is turned on based on the control signal REN. Thus, the memory cell is set to a state where data can be read. For distinction from the other transistors, the transistor 52 is hereinafter referred to as the read transistor 52.

The clamp transistor 51 is provided closer to the sense amplifier circuit 50 than the read transistor 52. The node ND1 is located closer to the sense amplifier circuit 50, and the node ND2 is located closer to the memory cell MC. The read transistor 52 is provided between the current path in the clamp transistor 51 and the global bit line GBL (bit line BL). The write circuit 18 is connected to the other end of the read transistor 52.

Like the clamp transistor 51 and the read transistor 52 on the memory cell MC side, a clamp transistor 51R and a read transistor 52R are provided on the reference cell RC side.

One end (source/drain) of a current path in the clamp transistor (for example, an N-type transistor) 51R is connected to a node ND1R of the sense amplifier circuit 50. The other end (source/drain) of the current path in the clamp transistor 51R is connected to one end of a current path in the read transistor 52R via a node ND2R. The one end of the current path in the read transistor (for example, an N-type transistor) 52R is connected to a node ND2R. The other end of the current path in the transistor 52R is connected to the reference global bit line RGBL. The clamp transistor 51R is provided closer to the sense amplifier circuit 50 than the read transistor 52R.

The control signal REF is supplied to a gate of the transistor 51R.

The clamp transistor 51R clamps the potential of the reference global bit line RGBL and the potential of the reference bit line RBL to a voltage value VREF according to a control signal (reference clamp signal) REF. For example, the voltage value VREF of the control signal REF is the same as a voltage value VCLM of the clamp signal CLM. However, the control signal REF may have a voltage value different from the voltage value VCLM of the clamp signal CLM.

The control signal REN is supplied to a gate of the read transistor 52. The read transistor 52 is turned on based on the control signal REN to make the reference cell RC electrically continuous with the sense amplifier circuit 50. A common read enable signal REN is supplied to the two read transistors 52, 52R.

For the clamp transistor 51R and the read transistor 52R on the reference cell side, the clamp transistor 51R is located on the sense amplifier side (on the high-voltage side), and the read transistor 52R is located on the reference cell side (low-voltage side) similar to the clamp transistor 51 and the read transistor 52 on the memory cell side.

As described above, the transistors 51, 51R, 52, 52R are control elements for the read operation and also function as voltage-current converters (or current sources). In accordance with the voltage applied to the gate, the transistors 51, 52 connected to the memory cell MC generate and output the read current Ird, and the transistors 51R, 52R connected to the reference cell RC generate and output the reference current Iref.

For example, the clamp transistors 51, 51R are high-breakdown-voltage transistors. Furthermore, the read transistors 52, 52R are low-breakdown-voltage transistors. For example, a breakdown voltage of a gate insulating film in the high-breakdown-voltage transistor is higher than that of a gate insulating film in the low-breakdown-voltage transistor. For example, the threshold voltages of the clamp transistor 51, 51R are higher than those of the read transistors 52, 52R.

When the clamp transistors 51, 51R and the read transistors 52, 52R have different characteristics, for example, the gate size of the clamp transistors 51, 51R is different from the gate size of the read transistors 52, 52R. The gate size of clamp transistors 51, 51R, which are high-breakdown-voltage transistors, is larger than those of the read transistors 52, 52R, which are low-breakdown-voltage transistors.

The clamp transistors 51, 51R may have the same characteristics/gate size as those of the read transistors 52, 52R.

FIG. 5 is an equivalent circuit diagram depicting a configuration example of the sense amplifier in the read circuit in the resistance change type memory of the present embodiment.

A sense amplifier 50 includes a plurality of P-type transistors (for example, P-type MOS transistors) 53a, 53b, 54a, 54b, and a plurality of N-type transistors (for example, N-type MOS transistors) 55a, 55b, 56a, 56b.

One end (source/drain) of a current path in the P-type transistor 53a is connected to a terminal to which a power supply voltage Vdd is applied (hereinafter referred to as a power supply terminal Vdd). The other end (source/drain) of the current path in the P-type transistor 53a is connected to a node (interconnect) NDa. A control signal (first sense enable signal) SEN1 is supplied to a control terminal (gate) of the P-type transistor 53a.

One end of a current path in the P-type transistor 53b is connected to the power supply terminal Vdd. The other end of the current path in the P-type transistor 53b is connected to a node (wire) NDb. The control signal (first sense enable signal) SEN1 is supplied to a gate of the P-type transistor 53b.

One end of a current path in the P-type transistor 54a is connected to a node NDc and the other end of the current path in the P-type transistor 54a is connected to the node NDa. A gate of the P-type transistor 54a is connected to the node NDb. The node NDc is connected to the power supply terminal Vdd.

One end of a current path in the P-type transistor 54b is connected to the node NDc and the other end of the current path in the P-type transistor 54b is connected to the node NDb. A gate of the P-type transistor 54b is connected to the node NDa.

One end of a current path in the N-type transistor 55a is connected to the node ND1. The other end of the current path in the N-type transistor 55a is connected to the node NDa. A gate of the N-type transistor 55a is connected to the node NDb.

One end of a current path in the N-type transistor 55b is connected to a node ND1R. The other end of the current path in the N-type transistor 55b is connected to the node NDb. A gate of the N-type transistor 55b is connected to the node NDa.

One end of a current path in the N-type transistor 56a is connected to a terminal to which the ground potential Vss is applied (ground terminal). The other end of the current path in the N-type transistor 56a is connected to the node ND1. A gate of the N-type transistor 56a is connected to a node NDd. A control signal (second sense enable signal) SEN2 is supplied to the node NDd.

One end of a current path in the N-type transistor 56b is connected to the ground terminal Vss and the other end of the current path in the N-type transistor 56b is connected to the node ND1R. A gate of the N-type transistor 56b is connected to the node NDd.

A timing for a sense operation of the sense amplifier circuit 50 is controlled by the sense enable signal SEN1. Timings for an amplifying operation of the sense amplifier circuit 50 and signal acquisition are controlled by the sense enable signal SEN2.

As described above, in the present embodiment, the read transistor 52 is provided between the clamp transistor 51 and the global bit line GBL.

In the MRAM in the present embodiment, the read transistor 52 allows the nodes ND1, ND2 to which the clamp transistor 51 is connected to be pre-charged before the read operation. Thus, the MRAM in the present embodiment allows prevention of an occurrence of a large read current resulting from noise applied to the clamp transistor.

In the MRAM in the present embodiment, the read transistor 52 allows the clamp transistor 51 to be electrically separated from the write circuit 18. Thus, the MRAM in the present embodiment allows the operation of the clamp transistor to be restrained from being unstable as a result of noise from the write circuit 18 during the read operation performed after the write operation.

(b) Operation Example

Figure 6:
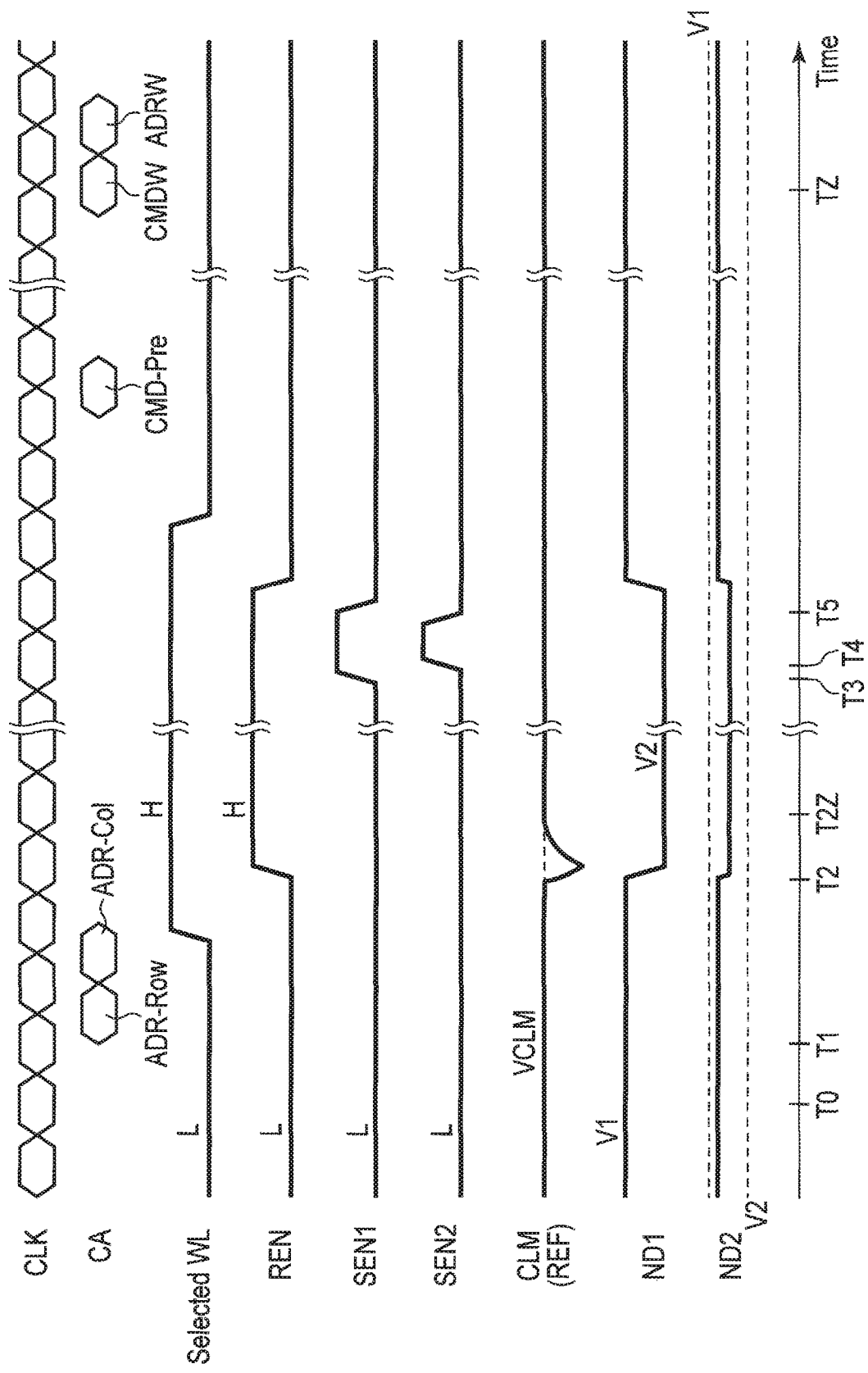
FIG. 6 is a timing chart illustrating an operation example of the resistance change type memory in the first embodiment.

With reference to FIG. 6, an operation example of the resistance change type memory in the present embodiment will be described. In this regard, in addition to FIG. 6, FIGS. 1 to 5 are referred to as needed.

FIG. 6 represents a timing chart illustrating the read operation on the resistance change type memory (for example, the MRAM) in the present embodiment. The axis of abscissas in FIG. 6 corresponds to time. The axis of ordinate in FIG. 6 corresponds to a signal level of each signal and a voltage value of each node.

[Time T0]

As depicted in FIG. 6, in the resistance change type memory (MRAM) in the present embodiment, the sequencer 15 sets the level of the sense enable signals SEN1, SEN2 and the read enable signal REN to an L (low) level at time T0 before command reception. The sequencer 15 sets the level of the control signal CLM to an H (high) level.

The L level is a voltage that sets the N-type transistor to an off state, while setting the P-type transistor to an on state. The H level is a voltage that sets the P-type transistor to the off state, while setting the N-type transistor to the on state. The voltage values corresponding to the L/H levels may vary among the transistors according to the characteristics of the transistor (for example, a threshold voltage for the transistor).

By the signal SEN1 at the L level, the P-type transistors 53a, 53b in the sense amplifier circuit 50 are turned on. By the signal SEN2 at the L level, the N-type transistors 56a, 56b in the sense amplifier circuit 50 are turned off.

The P-type transistors 53a, 53b in the on state charge the nodes NDa, NDb to a certain potential (for example, the power supply voltage Vdd).

Due to a rise in the potential of the nodes NDa, NDb, the P-type transistors 54a, 54b are turned off, and the N-type transistors 55a, 55b are turned on.

At this time, the N-type transistors 56a, 56b are off due to the signal SEN2 at the L level. Thus, the nodes ND1, ND1R are kept in a charged state.

In the present embodiment, the read transistor 52 is provided between the clamp transistor 51 and the global bit line GBL. By the read transistor 52 in the off state, the clamp transistor 51 is electrically separated from the global bit line GBL.

Hence, the MRAM in the present embodiment allows the nodes ND1, ND2 at the both ends of the current path in the clamp transistor 51 (the source and drain of the clamp transistor 51) to be pre-charged by setting the clamp transistor 51 to the on state. The potential of the node ND2 is lower than the potential of the node ND1 according to the characteristics of the clamp transistor 51 (for example, the threshold voltage).

The clamp transistor 51R and the read transistor 52R on the reference cell RC side have the same connection relations as those of the clamp transistor 51 and the read transistor 52 on the memory cell MC side. Hence, the nodes ND1R, ND2R connected to the clamp transistor 51R are pre-charged.

[Time T1]

As depicted in FIG. 6, at time T1, the memory controller 200 transmits a row address ADR-Row of a selected bank BK and a column address ADR-Col of the selected bank BK to the MRAM 100 along with an active command and a read command.

In the MRAM 100, the command-address latch circuit 13 receives the command and address ADR-Row, ADR-Col at a timing synchronized with a clock signal CLK.

The sequencer 15 controls operations of the voltage generator 14 and the read circuit 19 so as to perform the read operation based on a control signal CNT and the read command transferred from the command-address latch circuit 13.

The row decoder 20 and the word line driver 21 selects the word line WL based on the row address ADR-Row. A signal at the H level is applied to the selected word line to turn on the cell transistor 4 in the selected cell.

The column decoder 16 and the bit line control circuit 17 turn on the switch elements M1, M2 to select the global bit line/source line GBL, GSL and bit line/source line BL, SL, based on the column address ADR-CO1.

[Time T2]

At time T2, the sequencer 15 shifts the level of the read enable signal REN from the L level to the H level. Thus, the read transistors 52, 52R are turned on.

By the transistors 51, 52 in the on state, the read current Ird flows from the sense amplifier circuit 50 through the memory cell MC. By the transistors 51R, 52R in the on state, the reference current Iref flows from the sense amplifier circuit 50 through the reference cell RC.

In the present embodiment, the nodes ND1, ND2 are charged before the read enable signal REN and the sense enable signals SEN1, SEN2 are set to the H level.

The potential of the node ND1 lowers from a certain potential V1 (for example, the voltage Vdd) to a potential V2 (for example, the ground voltage Vss). The potential of the node ND2 lowers from the potential V1 to a certain potential V3. The potential V3 is higher than the potential V2.

In conjunction with a fluctuation in the potentials of the nodes ND1, ND2, the potential of the clamp signal CLM (a gate voltage of the clamp transistor 51) temporarily lowers from the desired potential VCLM.

For example, at a timing when the read transistor 52 is turned on, the gate voltages of the clamp transistors 51, 51R lower to prevent the read current Ird from overshooting to a value larger than the desired current value.

The potential of the ND1R, ND2R on the reference terminal side fluctuates as is the case with the nodes ND1, ND2, as the read enable signal REN changes from the L level to the H level. In conjunction with a fluctuation in the potentials of the nodes ND1R, ND2R, the potential of the reference clamp signal REF fluctuates.

At time T2Z, the level of the clamp signals CLM, REF returns to the target voltage value VCLM.

[Time T3]

After time T2Z, at time T3, the sequencer 15 shifts the sense enable signal SEN1 from the L level to the H level.

A period (signal development time) from time T2 (T2Z) to time T3 is provided to stabilize the current value of the read current Ird and the current value of the reference current Iref and to allow start of detection of the difference between the read current Ird in a stable state and the reference current Iref in the stable state.

By the sense enable signal SEN1 at the H level, the P-type transistors 53a, 53b are turned off. The nodes NDa, NDb are electrically separated from the power supply terminal Vdd by the P-type transistors in the off state. A charging of the nodes NDa, NDb by the P-type transistors 53a, 53b is stopped. The read current Ird is compared to the reference current Iref.

When the memory element (MTJ element) 3 is in a low-resistance state (resistance value R1), the current value of the read current Ird is larger than the current value of the reference current Iref. In this case, the node NDa (ND1) is discharged more significantly than the node NDb (ND1R), and the potential of the node NDa is lower than the potential of the node NDb. Thus, the P-type transistor 54b is turned on, whereas the N-type transistor 55b is turned off. Consequently, the node NDb is charged by the P-type transistor 54b in the on state, raising the potential of the node NDb. Accordingly, the P-type transistor 54a is turned off, whereas the N-type transistor 55a is turned on.

On the other hand, when the memory element 3 is in a high-resistance state, the current value of the read current Ird is smaller than the current value of the reference current Iref. In this case, the node NDb is discharged more significantly than the node NDa, and the potential of the node NDb is lower than the potential of the node NDa. Thus, the P-type transistor 54a is turned on, whereas the N-type transistor 55a is turned off. Consequently, the node NDa is charged by the P-type transistor 54a in the on state, raising the potential of the node NDa. Accordingly, the P-type transistor 54b is turned off, whereas the N-type transistor 55b is turned on.

[Time T4]

At time T4, the sequencer 15 changes the level of the sense enable signal SEN2 from the L level to the H level. The N-type transistors 56a, 56b are turned on based on the signal SEN2 at the H level.

When the N-type transistor 55a is on, the node NDa is discharged by the N-type transistors 55a, 56a in the on state, and the signal level of the node NDa is set to the L level. In this case, the N-type transistor 55b is off, and thus, the signal level of the node NDb is the H level even if the transistor 56b is in the on state.

A signal at the H level at a terminal SO and a signal at the L level at a terminal bSO are latched by a latch circuit (for example, a page buffer) in the read circuit 19.

On the other hand, when the N-type transistor 55b is on, the node NDb is discharged by the N-type transistors 55b, 56b in the on state, and the signal level of the node NDb is set to the L level. In this case, the N-type transistor 55a is off, and thus, the signal level of the node NDa is the H level.

A signal at the L level at a terminal SO and a signal at the H level at a terminal bSO are latched by the latch circuit in the read circuit 19.

Thus, in the sense amplifier circuit 50, the potential of the node NDa is different from the potential of the node NDb according to a magnitude relation between the read current Ird and the reference current Iref. The potential of the nodes NDa, NDb is amplified approximately to a drive voltage for the sense amplifier circuit 50. The amplified signal is output from the sense amplifier circuit 50, and a signal from the sense amplifier circuit 50 is loaded into the read circuit 19 as an output signal (data) from the memory cell MC.

[Time T5]

During a period at a time T5 or later, the sequencer 15 changes the level of the read enable signal REN and the sense enable signals SEN1, SEN2 from the H level to the L level.

By the read transistors 52, 52R in the off state, the clamp transistors 51, 51R are electrically separated from the global bit line GBL (and the write circuit 18). Thus, the sense amplifier circuit 50 stops loading the output signal from the memory cell. Accordingly, the nodes ND1, ND1R, ND2, ND2R are charged.

Subsequently, a pre-charge command CMD-Pre is transferred from the memory controller 200 to the MRAM 100. Based on the pre-charge command CMD-Pre, the sequencer 15 pre-charges interconnects in the bank BK (for example, the global bit lines and the bit lines in the memory cell array).

Data output from the memory cell is transferred to the memory controller 200 via the input/output circuit 12.

As described above, the read operation on the MRAM in the present embodiment is performed.

As depicted in FIG. 6, at time TZ, a write command CMDW and a select address ADRW are received by an MRAM 100, which then performs the write operation. In this case, by the read transistor 52 in the off state, the clamp transistor 51 is electrically separated from the global bit line GBL and the write circuit 18.

Hence, the MRAM in the present embodiment allows noise resulting from the write operation to be restrained from being applied to the clamp transistor 51. As a result, the MRAM in the present embodiment allows the potential of the clamp signal CLM (gate voltage of the clamp transistor 51) to be restrained from being varied by noise.

(c) Effects

When the transistor is provided between the clamp transistor and the bit line (global bit line) as in the resistance change type memory in the present embodiment, noise to which the clamp transistor may be subjected can be suppressed.

The clamp transistor is a transistor that supplies a current to the global bit line GBL. The clamp signal CLM is the gate voltage of the clamp transistor and controls the magnitude of the read current supplied to the global bit line GBL.

When the level of the clamp signal CLM increases due to noise applied to the clamp signal CLM, the current value of the read current increases.

For example, when the clamp transistor is connected between the global bit line GBL and the node ND2 in FIG. 4 and the read enable transistor is connected between the node ND1 and the node ND2 in FIG. 4 (this is hereinafter referred to as a comparative example), noise may occur in the clamp transistor as described below.

In the comparative example, the potential at the one and other ends of the current path in the clamp transistor is the L level. Then, at a timing when the read transistor is turned on, charge in the input terminal of the sense amplifier circuit is drawn to the global bit line GBL. Thus, the potential of the one and other ends (source/drain) of the current path in the clamp transistor rises. Accordingly, coupling between the gate and the source and coupling between the gate and the drain serve to raise the signal level of the clamp signal (the gate voltage of the clamp transistor) to increase the current value of the read current. The increase in the current value of the read current may cause the current value to overshoot and exceed the desired value (the magnetization inversion threshold for the storage layer).

In this case, due to the supply of the read current with a large current value to the memory cell, the magnetization in the storage layer in the MTJ element may invert. As a result, read disturb may occur in the MRAM in the comparative example.

In contrast, in the resistance change type memory in the present embodiment, the transistor 52 separates the clamp transistor 51 from the global bit line GBL to allow the one and other ends of the current path in the clamp transistor 52 to be pre-charged before the read operation.

Hence, the resistance change type memory in the present embodiment allows the potentials of the one and other ends of the current path in the clamp transistor 51 to be restrained from rising when the transistor 52 is turned on and allows avoidance of an increase in the voltage value of the gate voltage CLM of the clamp transistor.

Figure 7:
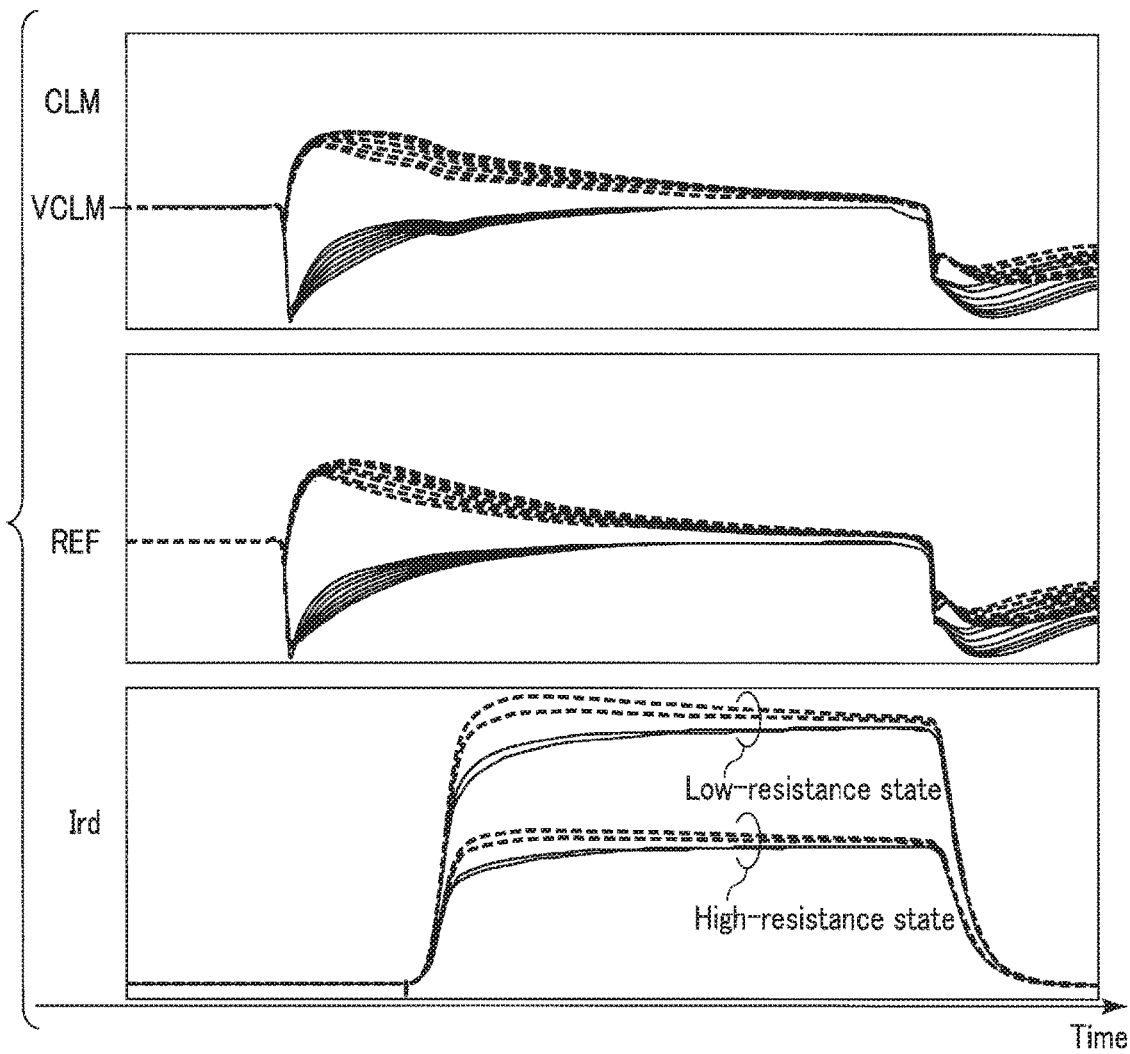
FIG. 7 is a diagram illustrating simulation results for the operation example of the resistance change type memory in the first embodiment.

FIG. 7 illustrates simulation results of the read operation on the resistance change type memory in the present embodiment.

The axis of abscissas in FIG. 7 corresponds to time. The axis of ordinate in FIG. 7 corresponds to the levels of the signals CLM, REF and the magnitude of the read current Ird.

In FIG. 7, solid lines represent the simulation results for the resistance change type memory in the present embodiment, and dashed lines represent the simulation results for the resistance change type memory in the above-described comparative example.

As depicted in FIG. 7, at a timing T2 when the read enable signal REN is set to the H level, the level of the clamp signal CLM decreases below a level (voltage value) VCLM.

Thus, the read current Ird flows through the memory cell MC without overshooting to a certain current value or larger (for example, the magnetization inversion threshold).

Therefore, the resistance change type memory in the present embodiment allows suppression of read disturb resulting from a large read current.

Furthermore, in the present embodiment, the transistor 52 between the clamp transistor 51 and the global bit line GBL electrically separates the clamp transistor 51 from the write circuit 18 and the global bit line GBL (bit line BL) during the write operation.

Thus, the resistance change type memory in the present embodiment allows noise resulting from the write operation to be restrained from being applied to the clamp transistor 51.

Accordingly, the resistance change type memory in the present embodiment enables shortening of a period until a signal returns from a state in which the signal is changed by noise after the write operation to a stable state. As a result, the MRAM in the present embodiment enables the period of the operational sequence to be shortened, allowing the operations to be sped up.

Furthermore, according to the present embodiment, the adverse effect of noise on the clamp signal (the gate voltage of the clamp transistor) can be reduced without an increase in the gate size of the clamp transistor. Thus, the resistance change type memory in the present embodiment enables a reduction in chip size or in chip costs.

As described above, the resistance change type memory in the first embodiment allows the data read to be improved.

(2) Second Embodiment

A resistance change type memory in a second embodiment will be described with reference to FIG. 8 and FIG. 9.

Figure 8:
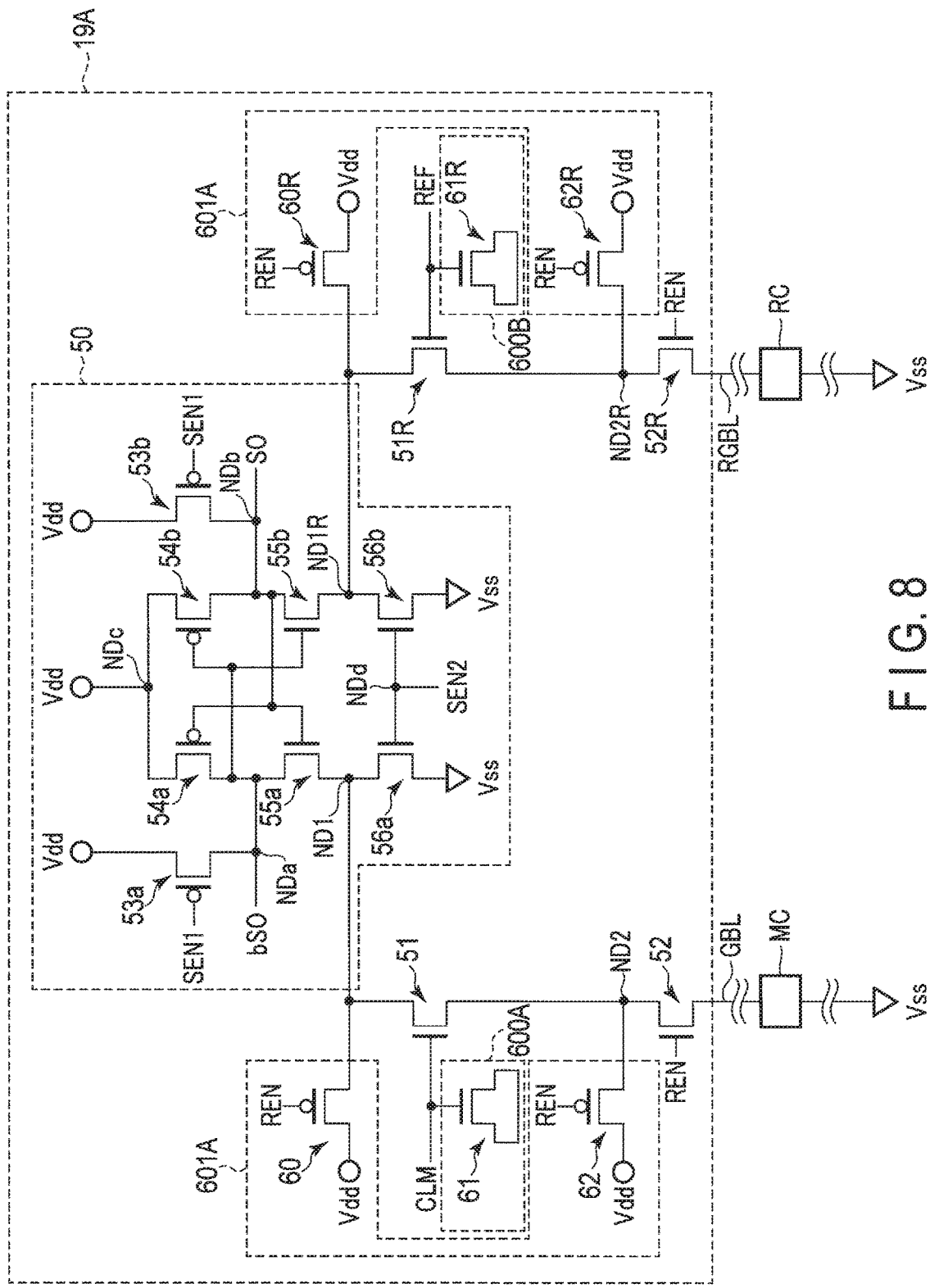
FIG. 8 is an equivalent circuit diagram depicting a configuration example of a resistance change type memory in a second embodiment.

FIG. 8 is an equivalent circuit diagram of a read circuit included in the resistance change type memory in the second embodiment.

As depicted in FIG. 8, the read circuit 19 includes a stabilization circuit 600 (600A, 600B).

The stabilization circuit 600 stabilizes the operations of the clamp transistor 51.

The stabilization circuit 600A includes an N-type transistor 61 on the memory cell MC side.

One end of a current path in the N-type transistor 61 is connected to the other end of a current path in the N-type transistor 61. A gate of the N-type transistor 61 is connected to the gate of the clamp transistor 51. The clamp signal CLM is supplied to the gate of the N-type transistor 61.

The stabilization circuit 600B includes an N-type transistor 61R on the reference cell side.

One end of a current path in the N-type transistor 61R is connected to the other end of a current path in the N-type transistor 61R. A gate of the N-type transistor 61R is connected to the gate of the clamp transistor 51R. The reference clamp signal REF is supplied to the gate of the N-type transistor 61R.

The N-type transistors 61, 61R function as stabilizing capacitors. The N-type transistors 61, 61R as the capacitors suppress a fluctuation in the gate voltages (clamp signals CLM, REF) of the clamp transistors 51, 51R. For example, the N-type transistors 61, 61R act in a direction in which the voltage values of the clamp signals CLM, REF are reduced when the read enable signal REN rises. Thus, the N-type transistors 61, 61R as capacitors suppress a rise in the signal level of the clamp signals CLM, REF to some degree.

Thus, the MRAM in the present embodiment allows the read operation to be stabilized.

As depicted in FIG. 8, the read circuit 19 includes an initialization circuit 601 (601A, 601B).

Before/at the start of the read operation, the initialization circuit 601 sets the node ND1 connected to the clamp transistors 51, 51R and the node ND2 connected to the read transistors 52, 52R to an initial state.

The initialization circuit 601 includes a plurality of P-type transistors 60, 60R, 62, 62R. The P-type transistors 60, 62 are provided on the memory cell MC side, and the P-type transistors 60R, 62R are provided on the reference cell side.

One end of the current path in the P-type transistor 60 is connected to the node ND1, and the other end of the current path in the P-type transistor 60 is connected to the power supply terminal Vdd. The read enable signal REN is supplied to the gate of the P-type transistor 60.

One end of the current path in the P-type transistor 60R is connected to the power supply terminal Vdd, and the other end of the current path in the P-type transistor 60R is connected to the node ND1R. The read enable signal REN is supplied to the gate of the P-type transistor 60R.

One end of the current path in the P-type transistor 62 is connected to the power supply terminal Vdd, and the other end of the current path in the P-type transistor 62 is connected to the node ND2. The read enable signal REN is supplied to the gate of the P-type transistor 62.

One end of the current path in the P-type transistor 62R is connected to the power supply terminal Vdd, the other end of the current path in the P-type transistor 62R is connected to the node ND2R. The read enable signal REN is supplied to the gate of the P-type transistor 62R.

Turn on/off of the P-type transistors 60, 60R, 62, 62R is controlled by the control signal REN common to the read transistors 52, 52R.

By the read enable signal REN at the H level, the P-type transistors 60, 60R, 62, 62R are off while the read transistors 52, 52R are on. Hence, during the read operation, the P-type transistors 60, 60R, 62, 62R electrically separates the power supply terminal from the nodes ND1, ND2.

By the read enable signal REN at the L level, the P-type transistors 60, 60R, 62, 62R are on while the read transistors 52, 52R are off.

Thus, while the read transistors 52, 52R are off (for example, during a period from time T0 to time T2 in FIG. 6), the P-type transistors 60, 60R, 62, 62R pre-charge the nodes ND1, ND1R, ND2, ND2R.

As described above, the initialization circuit 601 includes a circuit that pre-charges the nodes (pre-charge circuit).

The initialization circuit 601 charges the potential of the node ND2 to a power supply voltage level (H level).

Hence, in the MRAM in the present embodiment, the initialization circuit 601 allows the potential of the node ND2 connected to the clamp transistor 51 to be restrained from varying with each read operation.

Figure 9:
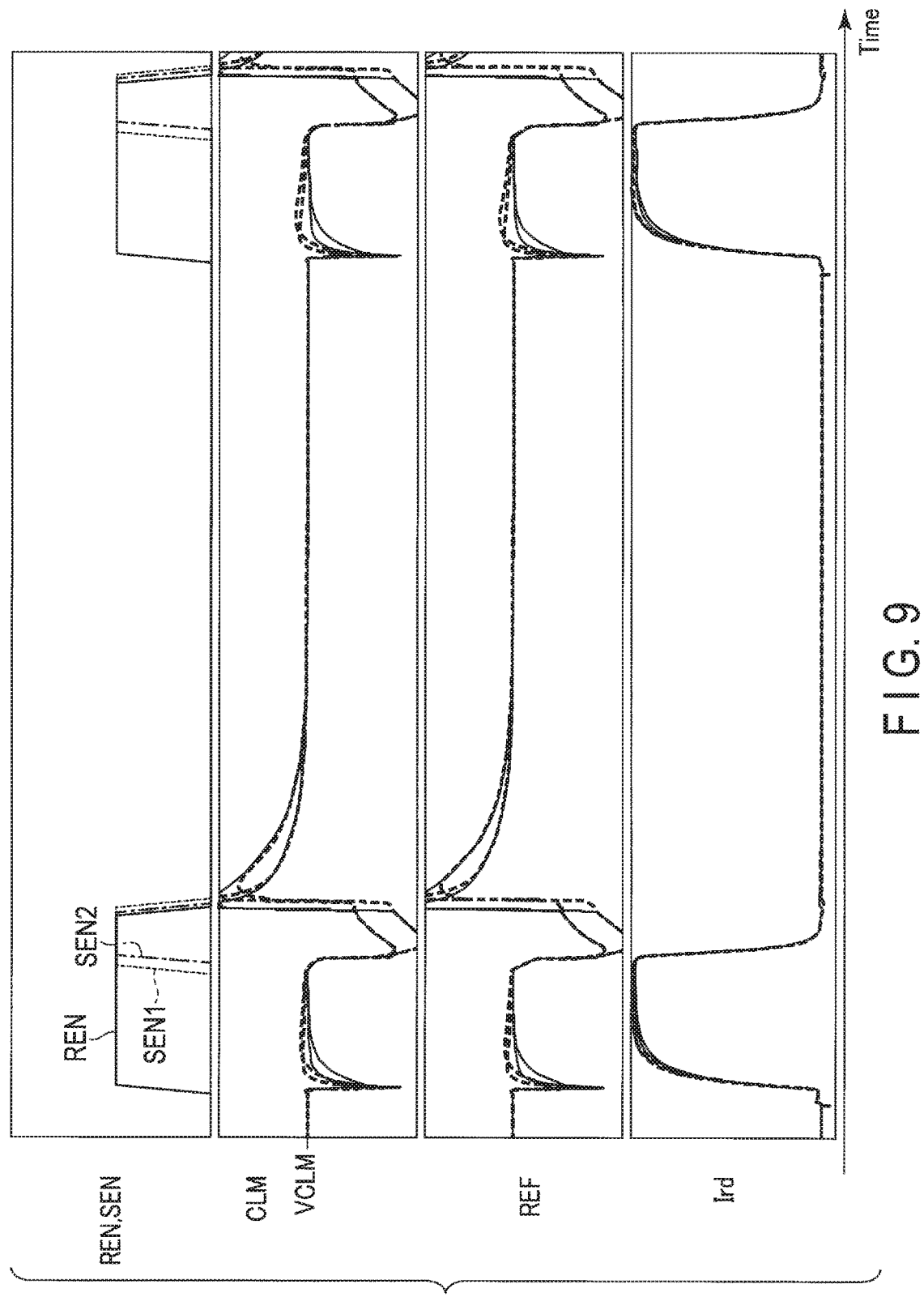
FIG. 9 is a diagram illustrating simulation results for an operation example of the resistance change type memory in the second embodiment.

FIG. 9 is a diagram illustrating simulation results for the MRAM in the second embodiment.

The axis of abscissas in FIG. 9 corresponds to time. The axis of ordinate in FIG. 9 corresponds to the levels of the signals REN, SEN1, SEN2, CLM and the read current Ird.

In FIG. 9, solid lines represent the simulation results for the resistance change type memory in the present embodiment and dashed lines represent the simulation results for a resistance change type memory in a comparative example.

In the MRAM in the present embodiment, the nodes ND1, ND2 are pre-charged by the initialization circuit 601.

Hence, compared to an MRAM in the comparative example in which the nodes are not pre-charged, the MRAM in the present embodiment allows suppression of fluctuation (overshooting) and variation in fluctuation during return of the potential of each of the clamp signals CLM, REF from a low potential to a target value when the read enable signal REN is set to the H level (when the supply of the read current is started). Thus, the MRAM in the present embodiment allows the read operation to be stabilized (homogenized).

Furthermore, in the MRAM in the present embodiment, the pre-charging of the nodes ND1, ND1R, ND2, ND2R allows the potential of each of the clamp signals CLM, REF to be restrained from having a value larger than the target value VCLM when the read currents Ird, Iref are supplied.

Thus, the MRAM in the present embodiment including the initialization circuit 601 enables a reduction in noise occurring in the clamp transistor during the read operation.

The MRAM in the present embodiment pre-charges the nodes for the read operation to allow the read operation to be sped up and stabilized.

As described above, the resistance change type memory in the second embodiment enables the read operation to be stabilized and sped up.

(3) Third Embodiment

A resistance change type memory in a third embodiment will be described with reference to FIG. 10.

Figure 10:
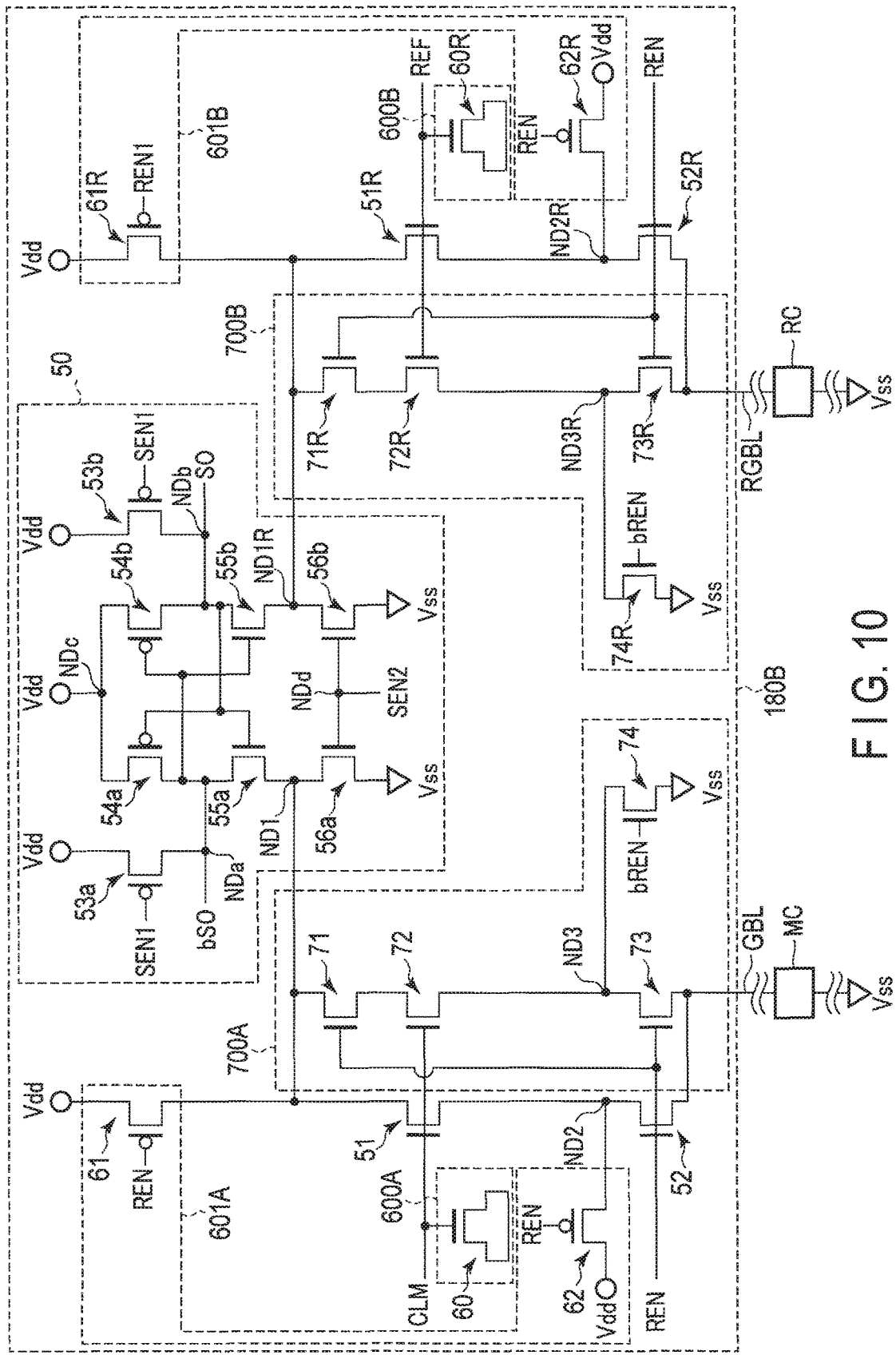
FIG. 10 is an equivalent circuit diagram depicting a configuration example of a resistance change type memory in a third embodiment.

FIG. 10 is an equivalent circuit of a read circuit included in the resistance change type memory in the third embodiment.

As depicted in FIG. 10, in the present embodiment, the read circuit 19 includes an isolation circuit 700 (700A, 700B).

The isolation circuit 700 separates the read circuit 19 from the write circuit 18 and the global bit lines GBL, RGBL while the read operation is not performed (for example, during the write operation).

The isolation circuit 700A on the memory cell side (a side of the first input terminal of the sense amplifier) is connected in parallel with the current paths in the clamp transistor 51 and the read transistor 52 between the node ND1 and the global bit line GBL.

The isolation circuit 700 includes N-type transistors 71, 72, 73, 74 on the memory cell MC side (a side of one input terminal of the sense amplifier).

One end of a current path in the N-type transistor 71 is connected to the node ND1, and the other end of the current path in the N-type transistor 71 is connected to one end of a current path in the N-type transistor 72. The other end of the current path in the N-type transistor 72 is connected to one end of a current path in the N-type transistor 73. The other end of the current path in the N-type transistor 73 is connected to the global bit line GBL.

One end of a current path in the N-type transistor 74 is connected to a connection node ND3 between the N-type transistor 72 and the N-type transistor 73. The other end of the current path in the N-type transistor 74 is connected to the ground terminal Vss.

The isolation circuit 700B on the reference cell side (a side of the second (reference) input terminal of the sense amplifier) is connected in parallel with the current paths in the clamp transistor 51R and the read transistor 52R between the node ND1R and the global bit line RGBL.

The isolation circuit 700B on the reference cell RC side includes N-type transistors 71R, 72R, 73R, 74R.

The transistors 71R, 72R, 73R, 74R on the reference cell RC side are connected as follows.

One end of a current path in the N-type transistor 71R is connected to the node ND1R. The other end of the current path in the N-type transistor 71R is connected to one end of a current path in the N-type transistor 72R, and the other end of the current path in the N-type transistor 72R is connected to one end of a current path in the N-type transistor 73R. The other end of the current path in the N-type transistor 73R is connected to the reference global bit line RGBL.

One end of a current path in the N-type transistor 74R is connected to a connection node ND3R between the N-type transistor 72R and the N-type transistor 73R. The other end of the current path in the N-type transistor 74R is connected to the ground terminal Vss.

The clamp signal CLM is supplied to a gate of the N-type transistor 72. The reference clamp signal REF is supplied to a gate of the N-type transistor 72R. The read enable signal REN is supplied to gates of the N-type transistors 71, 71R, 73, 73R. A control signal bREN is supplied to gates of the N-type transistors 74, 74R. The control signal bREN is an inversion signal of the read enable signal REN.

Thus, operations of the isolation circuit 700 are controlled by signals common to the clamp transistors 51, 51R and the read enable transistors 52, 52R.

When the clamp signals CLM, REF are set to the H level, the N-type transistors 72, 72R are turned on. The transistors 72, 72R have substantially the same function as that of the clamp transistors 51, 51R. The isolation circuit 700 functions as a voltage-current converter (current source).

During the read operation, when the read enable signal REN is set to the H level, the N-type transistors 71, 73 are turned on. At this time, the control signal bREN is set to the L level to turn off the transistor 74.

Thus, during the read operation, the N-type transistors 71, 72, 73 cooperate with the clamp transistor 51 and the read transistor 52 in connecting the node ND1 to the global bit line GBL.

Similarly, during the read operation, the N-type transistors 71R, 73R are turned on by the read enable signal REN at the H level, and the N-type transistor 74, 74R are turned off by the inversion signal (the signal at the L level) bREN. The N-type transistors 71R, 72R, 73R in the on state connect the node ND1R to the reference global bit line RGBL.

As described above, during the read operation, the isolation circuit 700 serves as a current path between the global bit line GBL and the node ND1 and a current path between the reference global bit line RGBL and the node ND1R.

When the read enable signal REN is at the L level as in the case of the write operation, the control signal bREN is at the H level. The transistors 74, 74R are turned on by the control signal bREN at the H level.

The nodes ND3, ND3R are connected to the ground terminal Vss via the N-type transistors 74, 74R in the on state. Thus, before the read operation is performed, the nodes ND3, ND3R are set to the initial state (discharged state).

The transistors 74, 74R in the on state absorb a current resulting from a fluctuation in the potentials of the global bit lines GBL, RGBL.

Hence, in the MRAM in the present embodiment, even when noise results from the write operation, noise is reduced which occurs in the nodes ND2, ND2R of the clamp transistors 51, 51R and in the nodes in the sense amplifier circuit 50.

The MRAM in the present embodiment includes a plurality of parallel current paths between the node ND1 in the sense amplifier circuit 50 and the global bit line GBL. The clamp transistors 51, 51R, 72, 72R are provided on the respective current paths. The current paths for the clamp transistors 51, 51R, 72, 72R are connected in parallel. As a result, the sizes of the clamp transistors 51, 51R, 72, 72R relatively increase, improving tolerance to noise.

Hence, the MRAM in the present embodiment enables a reduction in noise applied to the clamp transistor, allowing the read current (and the reference current) supplied to the memory cell to be stabilized.

The read circuit 19 in the MRAM in the present embodiment may omit the stabilization circuit 600 and the initialization circuit 601.

As described above, the MRAM in the present embodiment allows the reliability and the operational characteristics of the read operation to be improved.

(4) Modification

A modification of the resistance change type memory in the present embodiment will be described using FIG. 11.

FIG. 11 is an equivalent circuit diagram depicting a modification of the resistance change type memory (for example, an MRAM) in the present embodiment.

As depicted in FIG. 11, the read transistor 52 is provided between the node ND1 and an end ND1A of the current path in the clamp transistor 51. Furthermore, the read transistor 52R is provided between the node ND1R and an end ND1Z of the current path in the clamp transistor 51R.

In the present modification, a transistor 59 is provided between the clamp transistor 51 and the global bit line GBL. A transistor 59R is provided between the clamp transistor 51R and the reference global bit line RGBL.

During operations other than the read operation, the transistors 59, 59R electrically separate the clamp transistors 51, 51R from the global bit lines GBL, RGBL.

A control signal ISR is supplied to gates of the transistors 59, 59R.

The signal level of the control signal ISR is controlled at substantially the same timing as that for the read enable signal REN.

However, the control signal ISR may be set to the H level during a period between time T2 and time T3 in FIG. 6. The read enable signal REN may be supplied to the gates of the transistors 59, 59R.

Also in the read circuit 19 in FIG. 11, the transistors 59, 59R allow the clamp transistor 51 to be electrically separated from the global bit line GBL (and the write circuit 18) before the read operation, as is the case with the above-described embodiments.

Hence, the MRAM in the present modification produces effects similar to the effects of the above-described embodiments.

The read circuit 19 depicted in FIG. 11 may be provided with the pre-charge circuit 601 in the second embodiment in order to charge the nodes ND1, ND1A, ND1R, ND1Z, ND2, ND2R. Furthermore, the read circuit 19 depicted in FIG. 11 may be provided with the isolation circuit 700 in the third embodiment.

Memory using magnetoresistive elements is illustrated as the memory devices in the above-described embodiments. However, the memory device in the present embodiment is applicable to another memory device such as an FeRAM (Ferroelectric random access memory), a PCRAM (phase change random access memory), an ReRAM (resistive random access memory), or an ion memory.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A resistance change type memory comprising:
   a memory cell;
   a bit line connected to the memory cell; and
   a read circuit to execute reading of data from the memory cell,
   wherein:
   the read circuit includes:
      a first circuit having a first input terminal and detecting an output signal from the memory cell;
      a first transistor to control a current supplied to the memory cell based on a first control signal;
      a second transistor; and
      a third transistor,
   one terminal of the first transistor is connected to the first input terminal,
   the other terminal of the first transistor is connected to one terminal of the second transistor,
   the other terminal of the second transistor is connected to the bit line,
   the one terminal and the other terminal of the first transistor are charged before data is read from the memory cell,
   one terminal of the third transistor is connected to the other terminal of the first transistor, and
   the other terminal of the third transistor is connected to a power supply terminal.

2. The resistance change type memory of claim 1, wherein the second transistor is turned off before the data is read.

3. The resistance change type memory of claim 1, wherein:
   a second control signal is supplied to a gate of the second transistor, and
   the second transistor sets the memory cell to a state where data is enabled to be read from the memory cell based on the second control signal.

4. The resistance change type memory of claim 1, wherein:
   the read circuit includes a second circuit connected to the first transistor, and
   the second circuit charges at least one of the one terminal and the other terminal of the first transistor.

5. The resistance change type memory of claim 1, wherein:
   the second transistor is a transistor of a first conductivity type, and the third transistor is a transistor of a second conductivity type, and
   a second control signal is supplied to a gate of the second transistor and a gate of the third transistor.

6. The resistance change type memory of claim 1, wherein:
   the read circuit further includes a fourth transistor,
   one terminal of the fourth transistor is connected to the one terminal of the first transistor, and the other terminal of the fourth transistor is connected to the power supply terminal, and
   a second control signal is supplied to a gate of the second transistor and a gate of the fourth transistor.

7. The resistance change type memory of claim 1, wherein:
   the read circuit further includes a fourth transistor, a fifth transistor, a sixth transistor, and a seventh transistor,
   one terminal of the fourth transistor is connected to the one terminal of the first transistor,
   the other terminal of the fourth transistor is connected to one terminal of the fifth transistor,
   the other terminal of the fifth transistor is connected to one terminal of the sixth transistor,
   the other terminal of the sixth transistor is connected to the other terminal of the second transistor,
   one terminal of the seventh transistor is connected to the other terminal of the fifth transistor,
   the other terminal of the seventh transistor is connected to a ground terminal,
   the seventh transistor is on when the second transistor is off, and
   the seventh transistor sets a potential of the other terminal of the fifth transistor to a ground potential.

8. The resistance change type memory of claim 1, further comprising:
   a write circuit to execute writing of data to the memory cell,
   wherein the second transistor electrically separates the first transistor from the write circuit during the writing of the data.

9. The resistance change type memory of claim 1, wherein:
   the read circuit further includes a fourth transistor,
   one terminal of the fourth transistor is connected to the other terminal of the fourth transistor, and a gate of the fourth transistor is connected to a gate of the first transistor.

10. A resistance change type memory comprising:
a memory cell;
a bit line connected to the memory cell; and
a read circuit to execute reading of data from the memory cell,
wherein:
the read circuit includes:
a first circuit having a first input terminal and detecting an output signal from the memory cell;
a first transistor to control a current supplied to the memory cell based on a first control signal; and
a second transistor, a third transistor, a fourth transistor, a fifth transistor, and a sixth transistor,
one terminal of the first transistor is connected to the first input terminal,
the other terminal of the first transistor is connected to one terminal of the second transistor,
the other terminal of the second transistor is connected to the bit line,
the one terminal and the other terminal of the first transistor are charged before data is read from the memory cell,
one terminal of the third transistor is connected to the one terminal of the first transistor,
the other terminal of the third transistor is connected to one terminal of the fourth transistor,
the other terminal of the fourth transistor is connected to one terminal of the fifth transistor,
the other terminal of the fifth transistor is connected to the other terminal of the second transistor,
one terminal of the sixth transistor is connected to the other terminal of the fourth transistor,
the other terminal of the sixth transistor is connected to a ground terminal,
the sixth transistor is on when the second transistor is off, and
the sixth transistor sets a potential of the other terminal of the fourth transistor to a ground potential.

11. The resistance change type memory of claim 10, wherein the second transistor is turned off before the data is read.

12. The resistance change type memory of claim 10, wherein:
a second control signal is supplied to a gate of the second transistor, and
the second transistor sets the memory cell to a state where data is enabled to be read from the memory cell based on the second control signal.

13. The resistance change type memory of claim 10, wherein:
the read circuit includes a second circuit connected to the first transistor, and
the second circuit charges at least one of the one terminal and the other terminal of the first transistor.

14. The resistance change type memory of claim 10, wherein:
the read circuit further includes a seventh transistor, and
one terminal of the seventh transistor is connected to the other terminal of the first transistor, and the other terminal of the seventh transistor is connected to a power supply terminal.

15. The resistance change type memory of claim 14, wherein:
the second transistor is a transistor of a first conductivity type, and the seventh transistor is a transistor of a second conductivity type, and
a second control signal is supplied to a gate of the second transistor and a gate of the seventh transistor.

16. The resistance change type memory of claim 14, wherein:
the read circuit further includes an eighth transistor,
one terminal of the eighth transistor is connected to the one terminal of the first transistor, and the other terminal of the eighth transistor is connected to the power supply terminal, and
a second control signal is supplied to a gate of the second transistor and a gate of the eighth transistor.

17. The resistance change type memory of claim 10, further comprising:
a write circuit to execute writing of data to the memory cell,
wherein the second transistor electrically separates the first transistor from the write circuit during the writing of the data.

18. The resistance change type memory of claim 10, wherein
the read circuit further includes a seventh transistor,
one terminal of the seventh transistor is connected to the other terminal of the seventh transistor, and
a gate of the seventh transistor is connected to a gate of the first transistor.

19. A resistance change type memory comprising:
a memory cell;
a bit line connected to the memory cell;
a read circuit to execute reading of data from the memory cell; and
a write circuit to execute writing of data to the memory cell,
wherein:
the read circuit includes:
a first circuit having a first input terminal and detecting an output signal from the memory cell;
a first transistor to control a current supplied to the memory cell based on a first control signal; and
a second transistor,
one terminal of the first transistor is connected to the first input terminal,
the other terminal of the first transistor is connected to one terminal of the second transistor,
the other terminal of the second transistor is connected to the bit line,
the one terminal and the other terminal of the first transistor are charged before data is read from the memory cell, and
the second transistor electrically separates the first transistor from the write circuit during the writing of the data.

20. The resistance change type memory of claim 19, wherein the second transistor is turned off before the data is read.

* * * * *